United States Patent
Li et al.

(10) Patent No.: US 12,356,060 B2
(45) Date of Patent: Jul. 8, 2025

(54) ELECTRONIC DEVICE AND PHOTOGRAPHING MODULE THEREOF

(71) Applicant: VIVO MOBILE COMMUNICATION CO., LTD., Guangdong (CN)

(72) Inventors: Peide Li, Guangdong (CN); Shaojing Ma, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 82 days.

(21) Appl. No.: 18/343,347

(22) Filed: Jun. 28, 2023

(65) Prior Publication Data
US 2023/0345104 A1 Oct. 26, 2023

Related U.S. Application Data

(63) Continuation of application No. PCT/CN2021/142766, filed on Dec. 30, 2021.

(30) Foreign Application Priority Data

Dec. 31, 2020 (CN) .......................... 202011639273.2

(51) Int. Cl.
*H04N 23/55* (2023.01)
*H04N 23/958* (2023.01)
*H04N 25/20* (2023.01)

(52) U.S. Cl.
CPC ........... *H04N 23/55* (2023.01); *H04N 23/958* (2023.01); *H04N 25/20* (2023.01)

(58) Field of Classification Search
CPC .............. G02B 5/201; H01L 27/14621; H01L 27/14627; H04M 1/0264; H04N 23/10;
(Continued)

(56) References Cited

U.S. PATENT DOCUMENTS 6,570,613 B1 * 5/2003 Howell ................ H04N 23/843
348/E9.01
6,882,364 B1 4/2005 Inuiya et al.
(Continued)

FOREIGN PATENT DOCUMENTS

CN 104079904 A 10/2014
CN 106210677 A 12/2016
(Continued)

OTHER PUBLICATIONS

First Office Action for Chinese Application No. 202011639273.2, dated Jan. 11, 2022, 6 Pages.
(Continued)

*Primary Examiner* — Shahan Ur Rahaman
(74) *Attorney, Agent, or Firm* — BROOKS KUSHMAN P.C.

(57) ABSTRACT

An electronic device and a photographing module thereof are provided. The photographing module includes a lens, a driving element, and a photosensitive chip, where the photosensitive chip is a Bayer array sensor, the photosensitive chip includes a plurality of sub-pixel regions, each sub-pixel region includes a filtering sub-layer and a photosensitive sub-layer, the photosensitive chip includes a photosensitive layer and a filtering array layer, and the driving element is capable of driving the filtering array layer to switch between a first position and a second position.

12 Claims, 4 Drawing Sheets

(58) Field of Classification Search
CPC ...... H04N 23/12; H04N 23/125; H04N 23/45;
H04N 23/54; H04N 23/55; H04N 23/951;
H04N 23/958; H04N 25/10; H04N 25/11;
H04N 25/134; H04N 25/20; H04N 25/48
See application file for complete search history.

(56) References Cited

U.S. PATENT DOCUMENTS

| | | |
|---|---|---|
| 2011/0080487 A1 | 4/2011 | Venkataraman et al. |
| 2012/0236190 A1* | 9/2012 | Ogasahara ........... H04N 23/843 |
| | | 348/E9.01 |
| 2017/0041574 A1* | 2/2017 | Tanaka ................. H04N 25/135 |
| 2021/0392279 A1 | 12/2021 | Numata |

FOREIGN PATENT DOCUMENTS

| | | |
|---|---|---|
| CN | 207926763 U | 9/2018 |
| CN | 110445969 A | 11/2019 |
| CN | 111225135 A | 6/2020 |
| CN | 211406096 U | 9/2020 |
| CN | 112822366 A | 5/2021 |
| JP | 2020123862 A | 8/2020 |
| WO | 2020103210 A1 | 5/2020 |

OTHER PUBLICATIONS

International Search Report and Written Opinion for Application No. PCT/CN2021/142766, dated Mar. 2, 2022, 8 Pages.
Extended European Search Report for Application No. 21914581.0, dated Apr. 30, 2024, 8 Pages.
First Office Action for Indian Application No. 202317049355, dated Feb. 9, 2025, 5 Pages.

* cited by examiner

ELECTRONIC DEVICE AND PHOTOGRAPHING MODULE THEREOF

CROSS-REFERENCE TO RELATED APPLICATIONS

This application is a continuation of PCT International Application No. PCT/CN2021/142766 filed on Dec. 30, 2021, which claims priority to Chinese Patent Application No. 202011639273.2 filed on Dec. 31, 2020, which are incorporated herein by reference in its entireties.

TECHNICAL FIELD

This application relates to the field of communication device technologies, and specifically, to an electronic device and a photographing module thereof.

BACKGROUND

With the progress of science and technology, mobile phones and other electronic devices play an important role in production and life of people, and electronic devices are usually equipped with a photographing module to facilitate a user to perform photographing. With the increasingly fierce market competition, an electronic device usually has at least one outstanding performance to form a difference with other electronic devices, which improves the market competitiveness of electronic devices. For example, the electronic device has a high refresh rate, so that the electronic device has a high display performance; or the electronic device has dual speakers, so that the audio-visual effect is good. In another example, the photographing performance of the electronic device is strong. For the photographing performance of the electronic device, the performance of a photographing module can be improved in a plurality of manners.

Taking the imaging definition as an example, when a size of a photosensitive chip is fixed, the photosensitivity of the photographing module is reduced because of the increasing quantity of pixels, and an imaging result is also negatively affected. Therefore, the industry usually uses single-frame interpolation and multi-frame synthesis to improve the definition. However, in a process of forming an image by using single-frame interpolation, because a quantity of real photosensitive pixels does not increase, the improvement effect of the definition is limited, and interpolation errors are also prone to occur in some scenes; and in a process of forming an image by using multi-frame synthesis, the difficulty of controlling the pixel displacement is great, and the resultant image effect is also poor.

SUMMARY

This application discloses an electronic device and a photographing module thereof.

Embodiments of this application are implemented as follows:

According to a first aspect, an embodiment of this application discloses a photographing module, including a lens, a driving element, and a photosensitive chip, where the photosensitive chip is a Bayer array sensor, the photosensitive chip includes a plurality of pixel regions that are arranged in rows and columns, each pixel region includes four sub-pixel regions, and each sub-pixel region includes a filtering sub-layer and a photosensitive sub-layer, the photosensitive chip includes a photosensitive layer and a filtering array layer, the photosensitive layer is fixedly arranged relative to the lens, the filtering array layer is connected to the driving element, and the driving element is capable of driving the filtering array layer to switch between a first position and a second position relative to the lens;

in a case that the filtering array layer is located at the first position, light that is incident from the lens and passes through a first filtering sub-layer forms a first image through the photosensitive layer; in a case that the filtering array layer is located at the second position, light that is incident from the lens and passes through a second filtering sub-layer forms a second image through the photosensitive layer; and content of the first image is the same as content of the second image, and equivalent filtering sub-layers that are of the first filtering sub-layer and the second filtering sub-layer and that are in a same pixel region are any two filtering sub-layers in the pixel region.

According to a second aspect, an embodiment of this application discloses an electronic device, including the foregoing photographing module.

The embodiments of this application provide a photographing module, a lens thereof matches a photosensitive chip, and a filtering array layer of the photosensitive chip can switch between a first position and a second position, so that light that is incident from the lens can pass through a first filtering sub-layer and a second filtering sub-layer separately when a position of the filtering array layer changes, a first image and a second image are formed respectively on a photosensitive layer of the photosensitive chip, and content of the first image and the second image is the same. In addition, equivalent filtering sub-layers of the first filtering sub-layer and the second filtering sub-layer in the same pixel region are any two of the pixel regions.

BRIEF DESCRIPTION OF THE DRAWINGS

The accompanying drawings described herein are used for providing a further understanding of this application, and form part of this application. Exemplary embodiments of this application and descriptions thereof are used for explaining this application, and do not constitute any inappropriate limitation to this application. In the accompanying drawings.

REFERENCE NUMERALS

100—Housing,
200—Lens,
400—Photosensitive chip, 410—Photosensitive layer, 420—Filtering array layer, 401—First filtering sub-layer, 402—Second filtering sub-layer, 403—Third filtering sub-layer, 404—Fourth filtering sub-layer, 401'—First filtering sub-layer, 402'—Second filtering sub-layer, 403'—Third filtering sub-layer, 404'—Fourth filtering sub-layer,
500—Infrared filter,
600—Limiting element, 601—Limiting base, 602—Connecting portion, and 603—Movable space.

DETAILED DESCRIPTION

In order to make the objectives, technical solutions and advantages of this application clearer, the technical solutions of this application will be described clearly in combination with specific embodiments of this application and corresponding accompanying drawings. Obviously, the described embodiments are only part of the embodiments of this application and not the whole embodiments. All other embodiments obtained by a person of ordinary skill in the art based on the embodiments of this application shall fall within the protection scope of this application.

The technical solutions disclosed in each embodiment of this application is described in detail below in combination with accompanying drawings.

Figure 1:
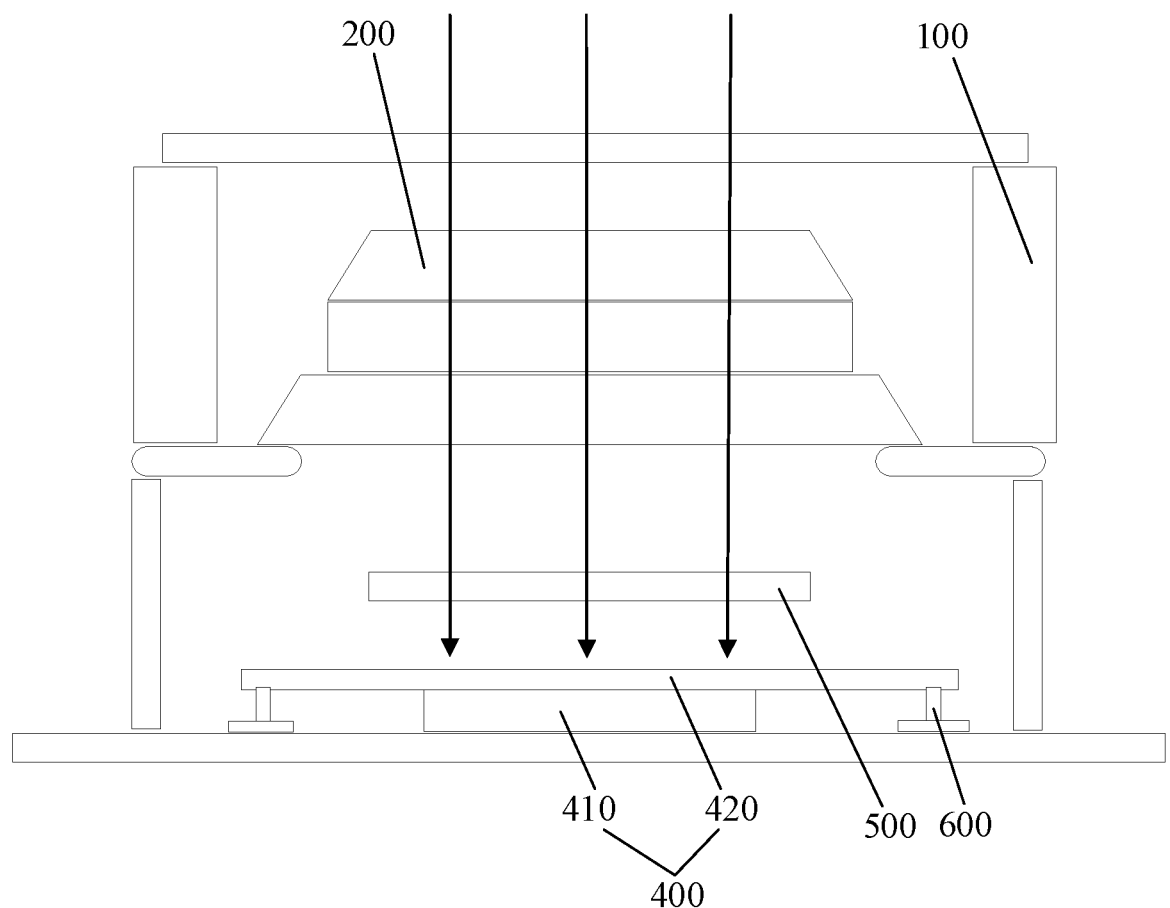
FIG. 1 is a schematic structural diagram of a photographing module according to an embodiment of this application.
Figure 2:
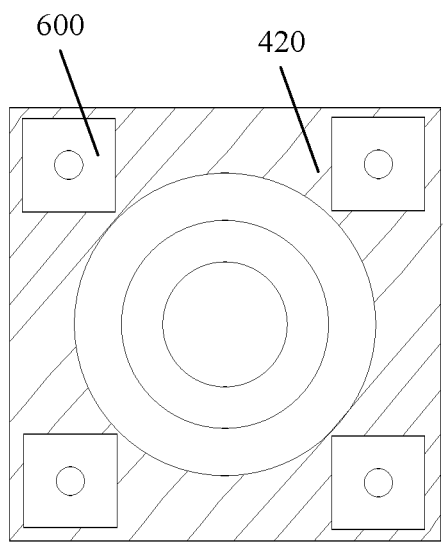
FIG. 2 is an assembly diagram of a filtering array layer and a limiting element in a photographing module according to an embodiment of this application.
Figure 3:
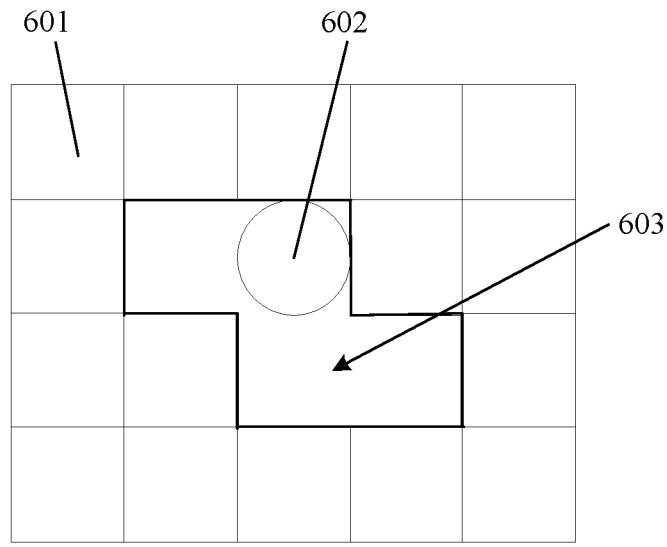
FIG. 3 is a schematic diagram of a limiting element in a photographing module according to an embodiment of this application.

As shown in FIG. 1 to FIG. 3, this application discloses a photographing module, and the photographing module includes a lens 200, a driving element, and a photosensitive chip 400. In addition, the photographing module further includes a housing 100. The foregoing elements can be mounted on the housing 100. The housing 100 may be made of plastic or metal. Certainly, the photographing module can also be provided with other structures. Considering the concise text, description will not be repeated herein.

The photosensitive chip 400 is an imaging sensor, and the photosensitive chip 400 is a Bayer array sensor, that is, photosensitive pixels in the photosensitive chip 400 are arranged in the way of Bayer array. The photosensitive chip 400 includes a plurality of pixel regions that are arranged in rows and columns, each pixel region includes four sub-pixel regions, and the four sub-pixel regions are arranged in a 2×2 matrix. The four sub-pixel regions may include two green pixels, one blue pixel, and one red pixel, and the two green pixels are arranged diagonally. The four sub-pixel regions in each pixel region may be divided into a first sub-pixel region, a second sub-pixel region, a third sub-pixel region, and a fourth sub-pixel region.

Generally, the photosensitive chip 400 may include a photosensitive layer 410 and a filtering array layer 420. Light passes through the filtering array layer 420 and illuminates the photosensitive layer 410. The filtering array layer 420 can filter light of different colors and enable the light that passes through the filtering array layer 420 to retain only one color component, such as red, blue, or green. The photosensitive layer 410 can be sensitive to light, so that the light that illuminates the photosensitive layer 410 forms an image.

As mentioned above, the photosensitive chip 400 includes the plurality of pixel regions, and each pixel region includes four sub-pixel regions. Specifically, each sub-pixel region is a part of the photosensitive chip 400, that is, each sub-pixel region includes a filtering sub-layer and a photosensitive sub-layer 410, and there are a plurality of sub-pixel regions, so that all filtering sub-layers jointly form the filtering array layer 420, and all photosensitive sub-layers 410 jointly form the photosensitive layer 410.

Each pixel region includes a first filtering sub-layer, a second filtering sub-layer, a third filtering sub-layer, and a fourth filtering sub-layer. In the filtering array layer 420 of the Bayer array sensor corresponding to each pixel region, four filters are arranged, and the four filters correspond to the four filtering sub-layers in a pixel region one by one; and the foregoing four filters generally include a red light filter, a blue light filter, and two green light filters, referred to as RGGB in short. In a case that types of filters arranged by different filtering sub-layers on the photosensitive layer 410 are different, colors of images formed by regions of the photosensitive layer 410 corresponding to different filtering sub-layers are also different.

In the photographing module provided in an embodiment of this application, the filtering array layer 420 is connected to the driving element, the driving element can drive the filtering array layer 420 to move relative to the lens 200, so that both the lens 200 and the photosensitive layer 410 can remain fixed, and only the motion of the filtering array layer 420 is controlled to improve the control accuracy and reduce the control difficulty.

Specifically, the lens 200 and the photosensitive layer 410 can be fixedly connected to the housing 100, and the filtering array layer 420 can be movably connected to the housing 100 through the driving element. The lens 200 and the photosensitive layer 410 may be fixed on the housing 100 through bonding. The driving element may be a miniature linear motor. The driving element can be mounted on the housing 100 through a connecting element such as a screw, and the filtering array layer 420 can be connected to a driving head of the driving element, so that the driving element can drive the filtering array layer 420 to move relative to the housing 100, that is, the filtering array layer 420 and the lens 200 can generate relative motion.

More specifically, the driving element can drive the filtering array layer 420 to switch between a first position and a second position relative to the lens 200. In the foregoing case, a relative position between the filtering array layer 420 and the lens 200 may be changed by adjusting the position of the filtering array layer 420, and then the light that is incident from the same position in the lens 200 can pass through different positions on the filtering array layer 420 and transmit on the photosensitive layer 410, and an image with a same content is formed through the photosensitive layer 410.

In a case that the filtering array layer 420 is located at the first position, the light that is incident from the lens 200 and passes through the first filter layer forms a first image through the photosensitive layer 410. In a case that the filtering array layer 420 is located at the second position, the light that is incident from the lens 200 and passes through the first filter layer forms a second image through the photosensitive layer 410.

It should be noted that, after one of the first image and the second image is formed, the driving element works to drive the filtering array layer 420 to change the position, and then the other is formed. Since the filtering array layer 420 only filters the color of the light, and does not affect parameters such as a propagation direction of the light basically, in a case that the whole photographing module is fixed, it can be considered that content of the images formed by the two imaging processes is the same, and then it can be ensured that content of the first image and the second image is the same.

Since the relative position of the lens 200 and the filtering array layer 420 changes in a process of forming the first image and the second image, the light passes through different positions in the filtering array layer 420 from the lens 200, so that the colors of the first image and the second image projected on the photosensitive chip 400 are different, that is, the color of the light that forms the first image is filtered by the first filtering sub-layer, and the color of the light that forms the second image is filtered by the second filtering sub-layer.

In a case that the displacement amount of the filtering array layer 420 is different, spacing between the first filtering sub-layer and the second filtering sub-layer that the light passes through twice is also different, so the first filtering sub-layer and the second filtering sub-layer are not located in the same pixel region. However, even if the first filtering sub-layer and the second filtering sub-layer are located in two pixel regions respectively, since both the first sub-filter layer and the second sub-filter layer have a corresponding filter, and structures of the plurality of pixel regions on the photosensitive chip 400 are the same, the pixel region in which the first filtering sub-layer is located must include a filtering sub-layer that is the same as the filter corresponding to the second filtering sub-layer. Accordingly, the pixel region in which the second filtering sub-layer is located must also include a filtering sub-layer that is the same as the filter corresponding to the first filtering sub-layer. Therefore, the first filtering sub-layer can be equivalent to another filtering sub-layer in the pixel region in which the second filtering sub-layer is located. The equivalent filtering sub-layers of the first filtering sub-layer and the second filtering sub-layer in the same pixel region are any two filtering sub-layers in the pixel region, that is, when the first filtering sub-layer is equivalent in the pixel region in which the second filtering sub-layer is located, an equivalent of the first filtering sub-layer is not necessarily the second filtering sub-layer. Accordingly, when the second filtering sub-layer is equivalent in the pixel region in which the first filtering sub-layer is located, an equivalent of the second filtering sub-layer is not necessarily the first filtering sub-layer.

In a case that the foregoing technical solution is adopted, take the foregoing light that is incident from a center of the lens 200 as an example, the light passes through the first filtering sub-layer through the lens 200 and is projected on the photosensitive layer 410 to form the first image; After that, the filtering array layer 420 is driven to move, and the light that is incident from the center of the lens 200 passes through the second filtering sub-layer and is projected on the photosensitive layer 410 again to form the second image.

By designing the displacement amount and the displacement direction of the filtering array layer 420, the foregoing light can be projected through the lens 200 to the first filtering sub-layer that is located in the filtering array layer 420 at the first position and that corresponds to the red filter, and the foregoing light can be projected through the lens 200 to the second filtering sub-layer that is located in the filtering array layer 420 at the second position and that corresponds to the green filter. Alternatively, the foregoing light can be projected first to the first filtering sub-layer that is in the filtering array layer 420 and that corresponds to the blue filter, and then the foregoing light is projected to the second filtering sub-layer that is in the filtering array layer 420 and that corresponds to the green filter. Alternatively, the foregoing light can be projected first to the first filtering sub-layer that is in the filtering array layer 420 and that corresponds to a first green filter, and then the foregoing light is projected to the second filtering sub-layer that is in the filtering array layer 420 and that corresponds to a second green filter. Adjacent to the bottom of the first green filter is the red filter, adjacent to the right is the blue filter, while adjacent to the top of the second green filter is the red filter, and adjacent to the left is the blue filter. That is, the positions of the first green filter and the second green filter in a pixel region are different.

In conclusion, the filtering processing result of the filter corresponding to the first filtering sub-layer in the filtering array layer 420 on the foregoing light is different from the filtering processing result of the filter corresponding to the second filtering sub-layer in the filtering array layer 420 on the foregoing light, which enables the same light to be processed by two filters respectively, and two images with the same content but different colors are formed. Based on the first image and the second image, synthesis is performed through a preset algorithm, which can increase true photosensitive pixels of each filtering channel on a composite image, thereby improving the resolution of the image, making the presentation of photos better, and improving the final image quality level and user experience. In addition, in the foregoing technical solution, a weight of the filtering array layer 420 driven by the driving element is relatively small, so that the driving difficulty of the driving element can be reduced.

As described above, the displacement amount and the displacement direction of the filtering array layer 420 can be designed to achieve the goal of forming the first image and the second image with the same content and different colors. Specifically, the displacement amount of the filtering array layer 420 may be a side length of the sub-pixel region, and the displacement direction of the filtering array layer 420 may be an extension direction of an edge of the sub-pixel region. Alternatively, the displacement amount of the filtering array layer 420 may be a sum of the side length of the sub-pixel region and the side length of n pixel regions, n being an integer, and n≥0.

In addition, a movement direction of the filtering array layer 420 may be determined according to the actual situation. For example, the filtering array layer 420 may generate a displacement amount that is equal to the side length of a sub-pixel region to the left in a plane perpendicular to an optical axis thereof, or the filtering array layer 420 may generate a displacement amount that is equal to the side length of the sub-pixel region to the bottom in a plane perpendicular to the optical axis thereof, or the filtering array layer 420 may generate a displacement amount that is equal to a size of a diagonal of the sub-pixel region to the lower left in a plane perpendicular to the optical axis thereof. This is not limited herein. In addition, in case that the movement directions of the filtering array layer 420 are different, the types of filters corresponding to the first filtering sub-layer and the second filtering sub-layer are also different.

Figure 4:
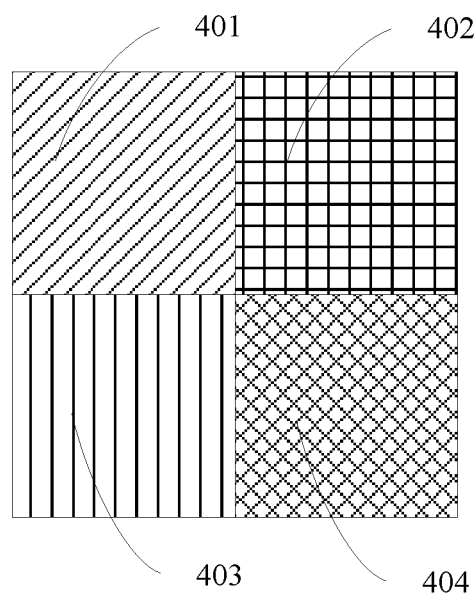
FIG. 4 is a schematic structural diagram of a pixel region of a filtering array layer in a photographing module according to an embodiment of this application.

More intuitively, as shown in FIG. 4, FIG. 4 shows the distribution of four filtering sub-layers in each pixel region in the filtering array layer 420, namely, the first filtering sub-layer 401, the second filtering sub-layer 402, the third filtering sub-layer 403, and the fourth filtering sub-layer 404.

The first filtering sub-layer 401 of the filtering array layer 420 located at the first position may face the center of the lens 200, that is, in a case that the filtering array layer 420 is located at the first position, the light that is incident from the center of the lens 200 can pass through the first filtering sub-layer 401 and project on the photosensitive layer 410. Correspondingly, after the position of the filtering array layer 420 changes, the corresponding relationship between the lens 200 and the filtering array layer 420 also changes. Specifically, after the filtering array layer 420 moves to the second position, the second filtering sub-layer 402' may face the center of the lens 200, that is, in a case that the filtering array layer 420 is located at the second position, the light that is incident from the center of the lens 200 may pass through the second filtering sub-layer 402' and project on the photosensitive layer 410. Although the second filtering sub-layer 402' and the second filtering sub-layer 402 can correspond to a same filter, both of them can also be located in two pixel regions respectively. The pixel region in which the second filtering sub-layer 402' is located further includes the first filtering sub-layer 401', the third filtering sub-layer 403', and the fourth filtering sub-layer 404'.

Figure 5:
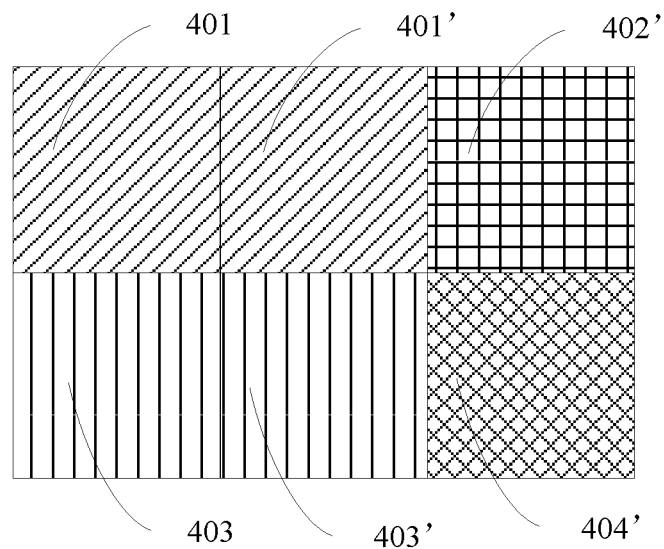
FIG. 5 is a comparison diagram of a relative position of a pixel region in which a first filtering sub-layer is located and a pixel region in which a second filtering sub-layer is located in a photographing module according to an embodiment of this application.
Figure 6:
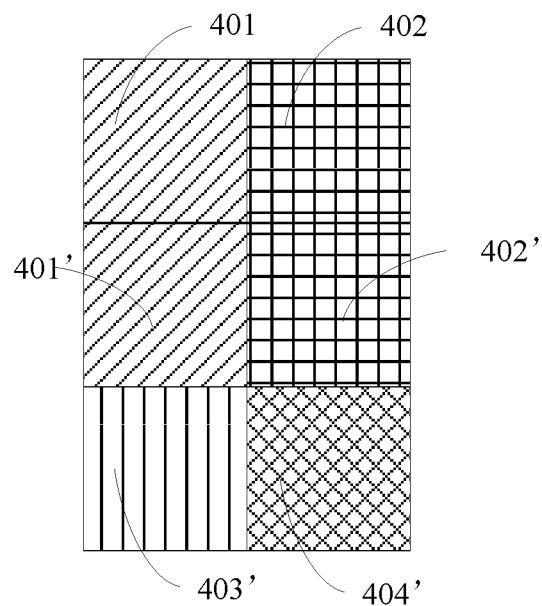
FIG. 6 is another comparison diagram of a relative position of a pixel region in which a first filtering sub-layer is located and a pixel region in which a second filtering sub-layer is located in a photographing module according to an embodiment of this application.
Figure 7:
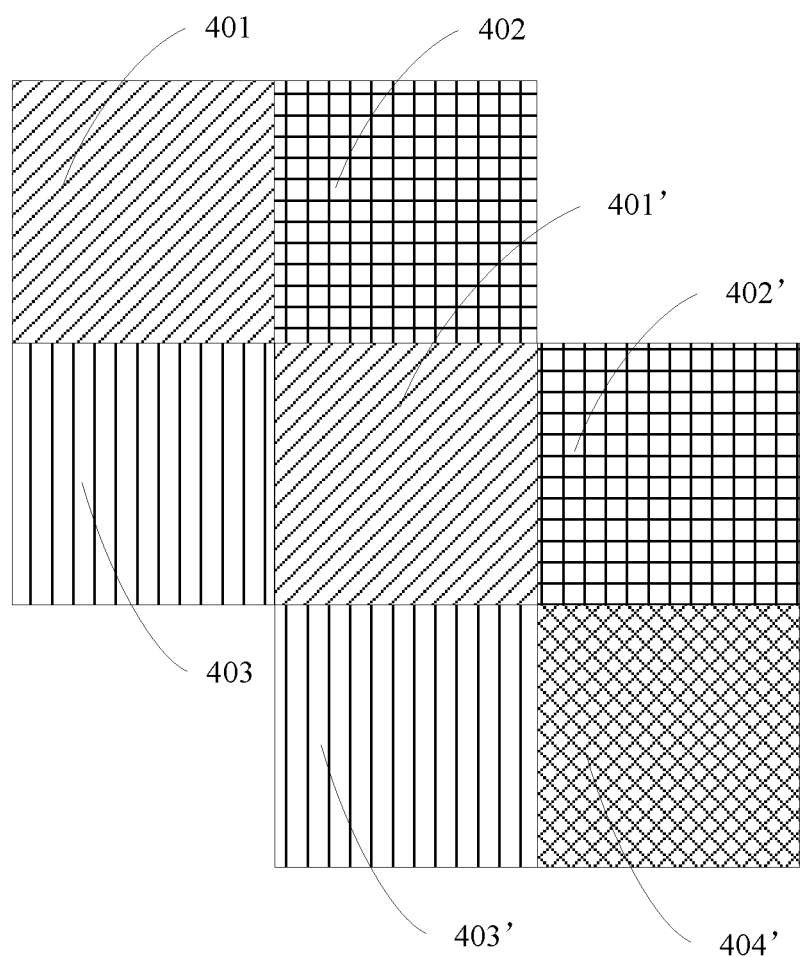
FIG. 7 is still another comparison diagram of a relative position of a pixel region in which a first filtering sub-layer is located and a pixel region in which a second filtering sub-layer is located in a photographing module according to an embodiment of this application.

In a process of driving the filtering array layer 420 to move, the filtering array layer 420 generates a displacement amount that is equal to the side length of a sub-pixel region to the left or below in a plane perpendicular to the optical axis thereof, or generates a displacement amount that is equal to the diagonal length of a sub-pixel region to the left and below, which makes the relative positions between the pixel region in which the first filtering sub-layer 401 is located and the pixel region in which the second filtering sub-layer 402' is located correspond to FIGS. 5 to 7 respectively.

The embodiments of this application provide a photographing module, a lens thereof matches a photosensitive chip, and a filtering array layer 420 of the photosensitive chip 400 can switch between a first position and a second position, so that light that is incident from the lens 200 can pass through a first filtering sub-layer and a second filtering sub-layer separately when a position of the filtering array layer 420 changes, a first image and a second image are formed respectively on a photosensitive layer of the photosensitive chip, and content of the first image and the second image is the same. In addition, equivalent filtering sub-layers of the first filtering sub-layer and the second filtering sub-layer in the same pixel region are any two of the pixel regions, which makes the filtering processing results of the filtering array layer 420 on the incident light different during the two imaging processes. Furthermore, synthesis of the first image and the second image with a preset algorithm can increase true photosensitive pixels of each filtering channel on a formed composite image, thereby improving the resolution of the image, making the presentation of photos better, and improving the final image quality level and user experience.

Optionally, in the photographing module provided in this embodiment of this application, the driving element can also drive the filtering array layer 420 to move to a third position, that is, the driving element can drive the filtering array layer 420 to switch among the first position, the second position, and the third position relative to the lens 200. Specifically, there are more than one driving elements, or the driving element may be capable of providing multi-directional driving forces. In a case that the filtering array layer 420 is located at the third position, the light that is incident from the lens 200 passes through the third filtering sub-layer of the filtering array layer 420 and forms a third image through the photosensitive layer 410. Content of the third image is the same as content of the first image, and equivalent filtering sub-layers that are of the first filtering sub-layer, the second filtering sub-layer, and the third filtering sub-layer and that are in a same pixel region are any three filtering sub-layers in the pixel region.

Adopting the foregoing technical solution, the style of the filtering processing results for the same light may be increased. After the first image, the second image, and the third image are synthesized through a preset algorithm, the true photosensitive pixels of each filtering channel on the synthesized image may be further increased, so as to further improve the resolution of the image. Specifically, through controlling the movement direction of the filtering array layer 420, the relative position relationship between the filtering array layer 420 and the lens 200 can be changed, so that the filtering sub-layer corresponding to the light that is incident from the lens 200 is changed, that is, the type of the filter through which the light that is incident from the lens 200 passes is changed to achieve the goal of increasing the filtering processing results for the same light. Optionally, the first filtering sub-layer, the second filtering sub-layer, and the third filtering sub-layer can correspond to a green filter, a red filter, and a blue filter respectively, which enables the resolution of the photosensitive pixels corresponding to RGB in the image to be improved, and makes the formation effect of the image better.

Further, in the photographing module provided in this embodiment of this application, the driving element can also drive the filtering array layer 420 to move to a fourth position, that is, the driving element can drive the filtering array layer 420 to switch among the first position, the second position, the third position, and the fourth position relative to the lens 200. In a case that the filtering array layer 420 is located at the fourth position, the light that is incident from the lens 200 passes through the fourth filtering sub-layer of the filtering array layer 420 and forms a fourth image through the photosensitive layer 410. Content of the fourth image is the same as content of the first image, and equivalent filtering sub-layers that are of the first filtering sub-layer, the second filtering sub-layer, the third filtering sub-layer, and the fourth filtering sub-layer and that are in a same pixel region are four filtering sub-layers in the pixel region.

Through adopting the foregoing technical solution, the style of the filtering processing results for the same light may be increased. After the first image, the second image, the third image, and the fourth image are synthesized through a preset algorithm, the true photosensitive pixels of each filtering channel on the synthesized image may be further increased, so as to further improve the resolution of the image. When the foregoing technical solution is adopted, compared with the solution in which the light is directly incident on the photosensitive chip, the resolution of the image of an R channel and the image of a B channel is increased by three times, and the resolution of the image of a G channel is increased by one time, so that the definition of the image is greatly increased.

In a process of driving the filtering array layer 420 by the driving element, precise control of a driving amount of the driving element can ensure that when moving, the filtering array layer 420 can move a preset displacement amount, and the displacement amount can be the side length of a sub-pixel region. In order to reduce the control difficulty of the photographing module, in another embodiment of this application, optionally, the photographing module further includes a limiting element 600, and the filtering array layer 420 is movably matches the lens through the limiting element.

The limiting element 600 includes a limiting base 601 and a connecting portion 602, and the limiting base 601 is movably connected to the connecting portion 602. The filtering array layer 420 and the driving head of the driving element can both be connected to the limiting base 601 or connected to the connecting portion 602, thereby controlling the displacement amount of the filtering array layer 420 through the limiting match relationship between the limiting base 601 and the connecting portion 602. For example, the limiting base 601 may be fixed on the housing 100, and the filtering array layer 420 and the driving head of the driving element are both connected to the connecting portion 602.

The limiting base 601 is provided with a first limiting groove, a second limiting groove, a third limiting groove, and a fourth limiting groove. The first limiting groove, the second limiting groove, the third limiting groove, and the fourth limiting groove are in communication to each other to form a movable space 603, so as to ensure that the connecting portion 602 can move in the movable space and be respectively limited in the foregoing four grooves.

In addition, in a case that the connecting portion 602 is limited in the first limiting groove, the filtering array layer 420 is located at the first position, in a case that the connecting portion 602 is limited in the second limiting groove, the filtering array layer 420 is located at the second position, in a case that the connecting portion 602 is limited in the third limiting groove, the filtering array layer 420 is located at the third position, and in a case that the connecting portion 602 is limited in the fourth limiting groove, the filtering array layer 420 is located at the fourth position.

Generally, through adopting the foregoing technical solution, the displacement amount of the filtering array layer 420 can be limited by the limiting element 600. When the filtering array layer 420 needs to be moved, the connecting portion is driven to move towards the corresponding position by the driving element, and the limiting base 601 can provide a reliable limiting effect. Therefore, when the connecting portion cannot continue to move in the corresponding direction, the filtering array layer 420 can be considered to have been driven to a target position, which reduces the difficulty of controlling the driving amount of the driving element.

Specifically, the specific sizes and structures of the first limiting groove, the second limiting groove, the third limiting groove, and the fourth limiting groove can be determined according to the actual conditions such as the size and shape of the connecting portion. Optionally, the first limiting groove, the second limiting groove, the third limiting groove, and the fourth limiting groove may all be a square structural element and have the same size as a sub-pixel region. Correspondingly, in order to ensure that the connecting portion can be normally limited, the connecting portion may also be a columnar structure with a square bottom surface.

Optionally, the foregoing four grooves can be connected to each other to form a square structure, that is, the four grooves correspond to four sub-pixel regions in the pixel region respectively, which are distributed in 2×2. In this case, when the connecting portion 602 matches the four grooves respectively, the filtering array layer 420 can be located at the first position, the second position, the third position, and the fourth position respectively, so as to form the first image, the second image, the third image, and the fourth image through the photosensitive layer 410 respectively.

In another embodiment of this application, the second limiting groove is connected to the third limiting groove, the first limiting groove is located at a side of a distribution direction of the second limiting groove and the third limiting groove, the fourth limiting groove is located at an other side of the distribution direction, the first limiting groove is connected to the second limiting groove, and the fourth limiting groove is connected to the third limiting groove. Generally, it can be considered that the second limiting groove is connected to a right side of the first limiting groove, the third limiting groove is connected to the lower part of the second limiting groove, and the fourth limiting groove is connected to a right side of the third limiting groove, so as to form a structure similar to a "Z" shape.

In a case that the foregoing technical solution is adopted, when the connecting portion 602 moves between any two adjacent grooves of the four grooves, the connecting portion 602 can be limited in a certain direction by the limiting base 601, and through combining the driving force provided by the driving element, the movement direction of the connecting portion 602 can be unique, further reducing the driving difficulty, and improving the movement precision.

As described above, the sizes of the first limiting groove and other grooves on the limiting base can be determined according to parameters such as the structure and the size of the connecting portion. Optionally, In the distribution direction of the first limiting groove and the second limiting groove, and the distribution direction of the second limiting groove and the third limiting groove, the size of the connecting portion is equal to the size of the sub-pixel region. In this case, the shapes and the sizes of a bottom surface of the first limiting groove, the second limiting groove, the third limiting groove, and the fourth limiting groove can correspond to the shape and the size of the sub-pixel region respectively. Therefore, the design and processing difficulty of the first limiting groove and the like are relatively low, and a reliable limiting relationship between the connecting portion and each limiting groove can be ensured. Specifically, the connecting portion may be a cylindrical structural element with a square bottom surface. In another embodiment of this application, the connecting portion 602 may be a cylindrical structural element. In this case, the contact area between the connecting portion 602 and the limiting base 601 is small, which can reduce the difficulty of the relative movement and reduce the driving difficulty.

The optical axis of the lens is perpendicular to a photosensitive surface of the photosensitive chip 400, that is, the photosensitive chip faces the lens. In this case, the design and installation difficulty of the lens and the photosensitive chip is relatively low, and a photosensitive amount of the photosensitive chip 400 can be improved, which improves the imaging effect. Certainly, in a case that there is a corresponding requirement, the photosensitive chip 400 may not face the lens 200. For example, the photographing module may be set as a periscope module, which can improve the zoom ratio of the photographing module.

Optionally, the photographing module provided in this embodiment of this application further includes an infrared filter 500. The infrared filter 500 is arranged on a light emitting side of the lens 200, that is, a light inlet side of the photosensitive chip 400. The infrared filter 500 can provide a filtering effect for the light incident into the photographing module through the lens 200, thereby filtering out unnecessary light that projects into the photosensitive chip 400, preventing the photosensitive chip 400 from generating false colors and/or ripples, and improving the effective resolution and color reduction of the photosensitive chip 400.

Optionally, the lens 200 is an extend depth of field lens. By designing the passing focal points of the three filtering channels R, G, and B of the lens 200 to be located at different positions, and allowing the three passing focal points to cover three focal segments, the longitudinal chromatic aberration of the three wave bands R, G, and B is increased, so as to cover the far, middle, and close distances. The far, middle, and close distances are relative concepts, that is, a farther distance is a position that is farther relative to the middle distance, and a closer distance is a position that is closer relative to the middle distance.

The lens 200 adopts the foregoing technical solution, so that three photos corresponding to the R channel, the G channel, and the B channel can be taken, and the three photos focus on the foregoing three distances: far, middle, and close. After that, based on a restoration algorithm, a window detection function can be used to detect the entire field of view to determine which of the three photos corresponding to the R channel, the G channel, and the B channel in each window is the clearest. After that, based on the clearest photo, the other two photos can be used for sharpness transformation using a deconvolution algorithm to synthesize photos that are relatively clear across the entire distance.

Based on the photographing module disclosed in any of the foregoing embodiments, an embodiment of this application further provides an electronic device. The electronic device includes the photographing module provided in any of the foregoing embodiments. Certainly, the electronic device further includes other elements such as a display module, a housing, and a battery. Considering the simplicity of the text, it will not be introduced herein.

The electronic device disclosed in this embodiment of this application may be a smartphone, a tablet computer, an e-book reader, or a wearable device. Certainly, the electronic device may also be other devices, and this embodiment of this application does not limit this.

In the above embodiments of the application, the differences between embodiments are mainly described. As long as the different optimization features between embodiments are not contradictory, they can be combined to form better embodiments. Considering the conciseness of the writing, no repeated description is provided.

The above are only embodiments of this application and are not intended to limit this application. For a person skilled in the art, various modifications and changes can be made to the present application. Any modification, equivalent replacement, or improvement made application spirit and principle of the present application shall fall within the scope of the claims of the present application.

What is claimed is:

1. A photographing module, comprising a lens, a driving element, and a photosensitive chip, wherein the photosensitive chip is a Bayer array sensor, the photosensitive chip comprises a plurality of pixel regions that are arranged in rows and columns, each pixel region comprises four sub-pixel regions, and each sub-pixel region comprises a filtering sub-layer and a photosensitive sub-layer, the photosensitive chip comprises a photosensitive layer and a filtering array layer, the photosensitive layer is fixedly arranged relative to the lens, the filtering array layer is connected to the driving element, and the driving element is capable of driving the filtering array layer to switch between a first position and a second position relative to the lens;

in a case that the filtering array layer is located at the first position, light that is incident from the lens and passes through a first filtering sub-layer forms a first image through the photosensitive layer; in a case that the filtering array layer is located at the second position, light that is incident from the lens and passes through a second filtering sub-layer forms a second image through the photosensitive layer; and content of the first image is the same as content of the second image, and equivalent filtering sub-layers that are of the first filtering sub-layer and the second filtering sub-layer and that are in a same pixel region are any two filtering sub-layers in the pixel region;

wherein the driving element is capable of driving the filtering array layer to switch among the first position, the second position, and a third position relative to the lens;

in a case that the filtering array layer is located at the third position, light that is incident from the lens and passes through a third filtering sub-layer forms a third image through the photosensitive layer; and content of the third image is the same as content of the first image, and equivalent filtering sub-layers that are of the first filtering sub-layer, the second filtering sub-layer, and the third filtering sub-layer and that are in a same pixel region are any three filtering sub-layers in the pixel region;

wherein the driving element is capable of driving the filtering array layer to switch among the first position, the second position, the third position, and a fourth position relative to the lens;

in a case that the filtering array layer is located at the fourth position, light that is incident from the lens and passes through a fourth filtering sub-layer forms a fourth image through the photosensitive layer; and content of the fourth image is the same as content of the first image, and equivalent filtering sub-layers that are of the first filtering sub-layer, the second filtering sub-layer, the third filtering sub-layer, and the fourth filtering sub-layer and that are in a same pixel region are four filtering sub-layers in the pixel region;

wherein the photographing module further comprises a limiting element, the filtering array layer movably matches the lens through the limiting element, the limiting element comprises a limiting base and a connecting portion, and the limiting base or the connecting portion is connected to the driving element; and the limiting base is provided with a first limiting groove, a second limiting groove, a third limiting groove, and a fourth limiting groove that are in communication with each other, in a case that the connecting portion is limited in the first limiting groove, the filtering array layer is located at the first position, in a case that the connecting portion is limited in the second limiting groove, the filtering array layer is located at the second position, in a case that the connecting portion is limited in the third limiting groove, the filtering array layer is located at the third position, and in a case that the connecting portion is limited in the fourth limiting groove, the filtering array layer is located at the fourth position.

2. The photographing module according to claim 1, wherein the second limiting groove is connected to the third limiting groove, the first limiting groove is located at a side of a distribution direction of the second limiting groove and the third limiting groove, the fourth limiting groove is located at an other side of the distribution direction, the first limiting groove is connected to the second limiting groove, and the fourth limiting groove is connected to the third limiting groove.

3. The photographing module according to claim 1, wherein in a distribution direction of the first limiting groove and the second limiting groove and in a distribution direction of the second limiting groove and the third limiting groove, a size of the connecting portion is equal to a side length of the sub-pixel region.

4. The photographing module according to claim 3, wherein the connecting portion is a cylindrical structural element.

5. The photographing module according to claim 1, wherein the photographing module further comprises an infrared filter, and the infrared filter is disposed at a light emitting side of the lens.

6. The photographing module according to claim 1, wherein the lens is an extend depth of field lens.

7. An electronic device, comprising a photographing module, wherein
the photographing module comprises a lens, a driving element, and a photosensitive chip, wherein the photosensitive chip is a Bayer array sensor, the photosensitive chip comprises a plurality of pixel regions that are arranged in rows and columns, each pixel region comprises four sub-pixel regions, and each sub-pixel region comprises a filtering sub-layer and a photosensitive sub-layer,
the photosensitive chip comprises a photosensitive layer and a filtering array layer, the photosensitive layer is fixedly arranged relative to the lens, the filtering array layer is connected to the driving element, and the driving element is capable of driving the filtering array layer to switch between a first position and a second position relative to the lens;
in a case that the filtering array layer is located at the first position, light that is incident from the lens and passes through a first filtering sub-layer forms a first image through the photosensitive layer; in a case that the filtering array layer is located at the second position, light that is incident from the lens and passes through a second filtering sub-layer forms a second image through the photosensitive layer; and content of the first image is the same as content of the second image, and equivalent filtering sub-layers that are of the first filtering sub-layer and the second filtering sub-layer and that are in a same pixel region are any two filtering sub-layers in the pixel region;
wherein the driving element is capable of driving the filtering array layer to switch among the first position, the second position, and a third position relative to the lens;
in a case that the filtering array layer is located at the third position, light that is incident from the lens and passes through a third filtering sub-layer forms a third image through the photosensitive layer; and content of the third image is the same as content of the first image, and equivalent filtering sub-layers that are of the first filtering sub-layer, the second filtering sub-layer, and the third filtering sub-layer and that are in a same pixel region are any three filtering sub-layers in the pixel region;
wherein the driving element is capable of driving the filtering array layer to switch among the first position, the second position, the third position, and a fourth position relative to the lens;
in a case that the filtering array layer is located at the fourth position, light that is incident from the lens and passes through a fourth filtering sub-layer forms a fourth image through the photosensitive layer; and content of the fourth image is the same as content of the first image, and equivalent filtering sub-layers that are of the first filtering sub-layer, the second filtering sub-layer, the third filtering sub-layer, and the fourth filtering sub-layer and that are in a same pixel region are four filtering sub-layers in the pixel region;
wherein the photographing module further comprises a limiting element, the filtering array layer movably matches the lens through the limiting element, the limiting element comprises a limiting base and a connecting portion, and the limiting base or the connecting portion is connected to the driving element; and
the limiting base is provided with a first limiting groove, a second limiting groove, a third limiting groove, and a fourth limiting groove that are in communication with each other, in a case that the connecting portion is limited in the first limiting groove, the filtering array layer is located at the first position, in a case that the connecting portion is limited in the second limiting groove, the filtering array layer is located at the second position, in a case that the connecting portion is limited in the third limiting groove, the filtering array layer is located at the third position, and in a case that the connecting portion is limited in the fourth limiting groove, the filtering array layer is located at the fourth position.

8. The electronic device according to claim 7, wherein the second limiting groove is connected to the third limiting groove, the first limiting groove is located at a side of a distribution direction of the second limiting groove and the third limiting groove, the fourth limiting groove is located at an other side of the distribution direction, the first limiting groove is connected to the second limiting groove, and the fourth limiting groove is connected to the third limiting groove.

9. The electronic device according to claim 7, wherein in a distribution direction of the first limiting groove and the second limiting groove and in a distribution direction of the second limiting groove and the third limiting groove, a size of the connecting portion is equal to a side length of the sub-pixel region.

10. The electronic device according to claim 9, wherein the connecting portion is a cylindrical structural element.

11. The electronic device according to claim 7, wherein the photographing module further comprises an infrared filter, and the infrared filter is disposed at a light emitting side of the lens.

12. The electronic device according to claim 7, wherein the lens is an extend depth of field lens.

* * * * *